United States Patent [19]
Erickson et al.

[11] Patent Number: 6,100,705
[45] Date of Patent: Aug. 8, 2000

[54] METHOD AND STRUCTURE FOR VIEWING STATIC SIGNAL LEVELS ON INTEGRATED CIRCUITS USING ELECTRON BEAM DEFLECTION DEVICE

[75] Inventors: Charles R. Erickson, Fremont; Brian D. Erickson, Soquel, both of Calif.

[73] Assignee: Xilinx, Inc., San Jose, Calif.

[21] Appl. No.: 09/216,278

[22] Filed: Dec. 18, 1998

[51] Int. Cl.[7] .................................................. G01R 31/305
[52] U.S. Cl. .......................... 324/751; 324/751; 324/765; 250/310; 250/311
[58] Field of Search .................................. 324/751, 765, 324/158.1, 763; 250/310, 311; 714/721, 733, 734, 745; 257/48

[56] References Cited

U.S. PATENT DOCUMENTS

5,633,595   5/1997   Ueda et al. ............................... 324/751
5,682,104   10/1997   Shido ........................................ 324/751

*Primary Examiner*—Safet Metjahic
*Assistant Examiner*—Anjan K. Deb
*Attorney, Agent, or Firm*—Patrick T. Bever, Esq.; Edel M. Young

[57] ABSTRACT

A method and structure for testing static signal levels on an integrated circuit device using an electron beam deflection device. Each static signal is applied to a first terminal of a switch, such as an AND gate, an OR gate, or a pass transistor. An alternating control signal of approximately 1 MHz is transmitted to a second terminal of the switch such that the switch generates an output signal that is either constant (if the static signal is at a first level), or has a frequency equal to that of the alternating control signal (if the static signal is at a second level). The output signal is transmitted to a pad located on an exposed surface of the integrated circuit, where an electron beam deflection device is utilized to determine the static signal level by detecting the presence or absence of an alternating signal. A method for determining the voltage level of a signal includes applying the signal to the gate of a transistor and an alternating control signal to an input terminal. An electron beam deflection device is then utilized to measure the voltage level of a signal generated at an output terminal of the transistor. The voltage level of the signal is then calculated by adding the measured voltage level and a threshold voltage of the transistor.

18 Claims, 6 Drawing Sheets

METHOD AND STRUCTURE FOR VIEWING STATIC SIGNAL LEVELS ON INTEGRATED CIRCUITS USING ELECTRON BEAM DEFLECTION DEVICE

FIELD OF THE INVENTION

The present invention relates to integrated circuits, and more particularly to methods and structures for troubleshooting integrated circuits.

BACKGROUND OF THE INVENTION

Figure 1A:
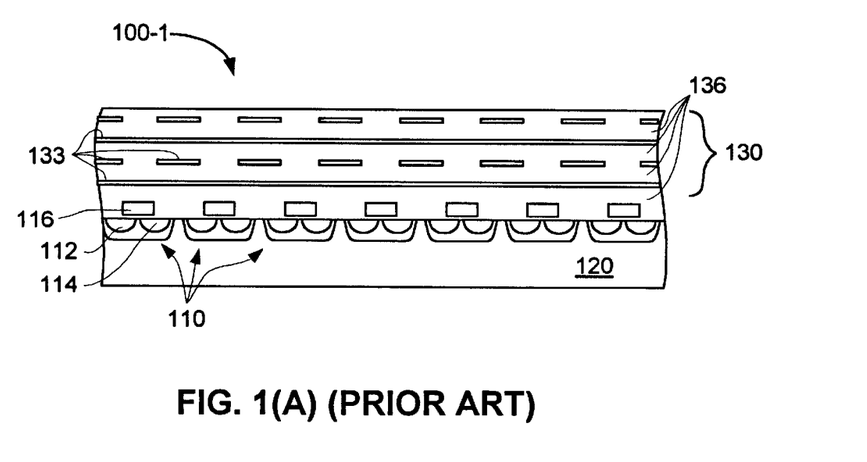
FIG. 1(A) is a cross sectional diagram showing a simplified conventional IC.

FIG. 1(A) is a cross sectional view showing a simplified integrated circuit (IC) device 100-1. IC device 100-1 includes numerous transistors 110 that are fabricated on a substrate 120, such as a silicon wafer. Transistors 110 include source regions 112 and drain regions 114 diffused into substrate 120, and a gate structure 116 formed over a channel separating source region 112 and drain region 114. Formed over transistors 110 is a conductor region 130 including alternating layers of metal lines 133 and insulating material 136 (such as silicon dioxide). Metal lines 133 are used to transmit signals between the various transistors 110 of IC device 100-1.

Programmable logic devices (PLDs) are a type of IC device that include logic resources and associated interconnect resources that are selectively controlled to implement user-defined logic operations (that is, a user's circuit design). In SRAM-based PLDs, the interconnect resources typically include pass transistors whose gates are controlled by SRAM cells to connect interconnect line segments such that signal paths are formed in accordance with a logic operation. These SRAM cells are often programmed once during a configuration phase, and then remain turned on or turned off (i.e., static) during subsequent operational phases.

Figure 1B:
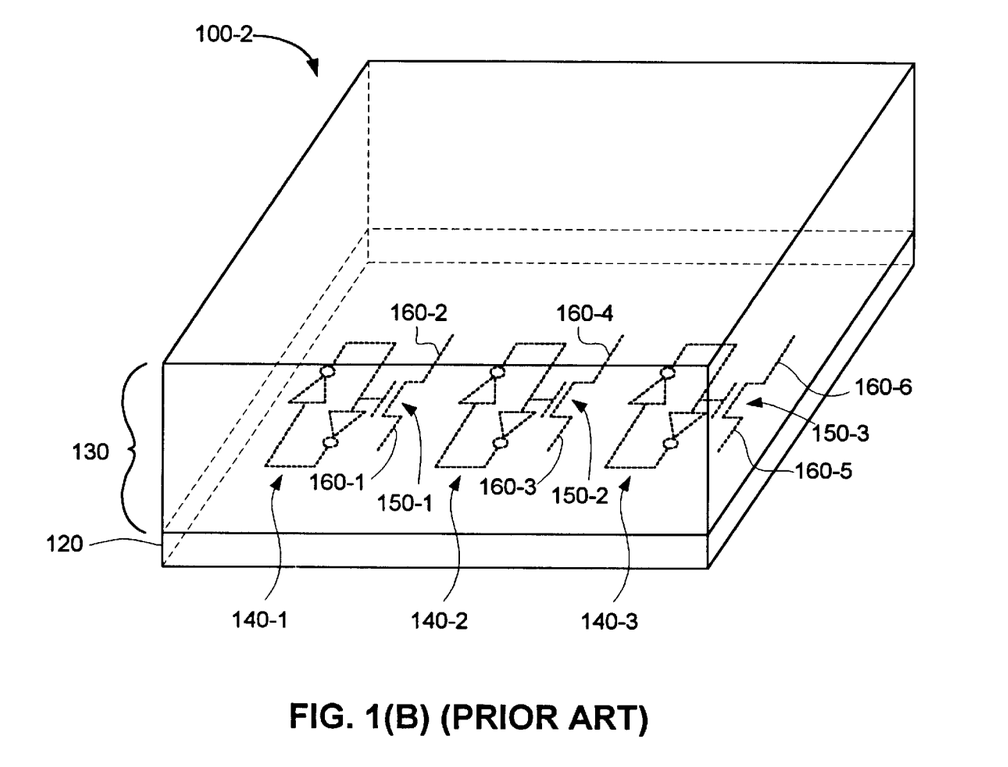
FIG. 1(B) is a perspective view showing a conventional PLD.

FIG. 1(B) is a simplified perspective view depicting portions of the interconnect resources of a PLD 100-2. Like IC 100-1 (FIG. 1(A)), PLD 100-2 includes transistors (not shown) formed on a substrate 120 under a conductor region 130 made up, for example, of layers of metal lines and insulation material (not shown). Some of the transistors of PLD 100-2 are utilized to form SRAM cells 140-1 through 140-3 (each illustrated as two inverters connected in a loop) that store configuration data used to control an associated pass transistor 150-1 through 150-3. Pass transistors 150-1 through 150-3 are connected between associated pairs of interconnect line segments 160-1 through 160-6. As mentioned above, interconnect line segments 160-1 through 160-6 are connected, for example, to logic resources (not shown) of PLD 100-2. To implement a particular logic operation, a user configures SRAM cells 140-1 through 140-3 such that signals are transmitted (or not transmitted) based on the state (open or closed) of pass transistors 150-1 through 150-3.

Electron beam deflection devices have been used for several years to debug (test) ICs during development. These devices typically include an electron beam emission device, an imaging device for directing the electron beam to a point on an IC-under-test, and a reception device for measuring the energy distribution of electrons leaving the point of the IC-under-test in response to electron beam bombardment. Electron beam deflection devices are able to view (measure) the presence or absence of an alternating signal at a selected point on the surface of the IC-under-test by detecting fluctuations in the energy distribution of electrons reflected from the selected point. Therefore, a test engineer is able to debug (test) an IC by applying predetermined input signals and viewing (measuring) the resulting currents through conductors exposed on a surface of the IC.

There are several problems associated with the use of electron beam deflection devices to troubleshoot ICs after fabrication. A first problem arises because most of the conductors of the IC (i.e., interconnect line segments 160-1 through 160-6 of a PLD 100-2 shown in FIG. 1(B)) are obscured by one or more insulation/metal lines associated with conductor region 130 (see FIG. 1(A)). A second problem is that several of the conductors of an IC (such as the SRAM cells 140-1 through 140-3 shown in FIG. 1(B)) are maintained at a static signal level (i.e., high or low). As mentioned above, electron beam deflection devices detect alternating signals; they are unable to detect these static signals.

What is needed is a method and structure for testing static signals generated at points buried within ICs that can be performed using electron beam deflection devices.

SUMMARY OF THE INVENTION

The present invention is directed to a method and structure for testing static signal levels generated at points (nodes) of ICs using electron beam deflection devices. The method includes applying a test (e.g., static) signal level to the first terminal of a switch, and transmitting an alternating control signal to the second terminal of the switch. The switch is constructed such that an output signal is generated that is alternating if the test signal has a first level (e.g., logic high) and has a static level if the test signal has a second level (e.g., logic low). This output signal is transmitted to a pad located on an exposed surface of the integrated circuit. The electron beam deflection device is then utilized to measure the output signal at the pad. By converting static test signals to constant or alternating output signals (depending upon the signal level), static signal levels generated in an IC can be determined by electron beam deflection devices. In addition, by transmitting the output signal to a pad located on a surface of the IC, static signal levels generated deep within the IC can be conveniently scanned using electron beam deflection device.

In accordance with a first embodiment of the present invention, an IC includes a substrate and a plurality of electronic devices formed on the substrate under a conductor region made up of alternating layers of metal lines and insulation material. The electronic devices include a cell for generating a static signal at a point located under the conductor region, and a switch connected to the point. The switch is controlled by an alternating signal such that the switch generates an alternating output signal if the static signal is at a first level, and generates a constant (direct current) signal if the static signal is at a second level. The output signal generated by the switch is transmitted to a pad located on a surface of the conductor region. By controlling the switch with an alternating signal, the output signal generated by the switch can be used in conjunction with an electron beam deflection device to determine the static signal (high or low) at the point.

In accordance with a second embodiment of the present invention, a single pad is utilized to determine the static signal levels at several points of the IC device by utilizing a multiplexing circuit to connect a selected switch output signal to the pad.

In accordance with a third embodiment of the present invention, a method is provided for determining the voltage level of a signal generated at a node in an integrated circuit using an electron beam deflection device. The method includes applying the signal to a first terminal of a switch and an alternating control signal to a second terminal of the switch. The electron beam deflection device is then utilized to determine a measured voltage level of an alternating output signal generated in a conductor connected to a third terminal of the switch. The voltage level of the signal is then calculated by adding the measured voltage level of the alternating signal and the threshold voltage of the switch. In one example, the switch comprises an N-channel transistor, and the signal is applied to a gate of the N-channel transistor. The alternating control signal has a peak value that is greater than a peak voltage level of the signal plus a threshold voltage of the switch. Under these conditions, the voltage level of the signal is calculated by adding the threshold voltage and the measured voltage level. In another example, the switch is a P-channel transistor, and the voltage level of the signal is calculated by subtracting the threshold voltage from the measured voltage level.

DETAILED DESCRIPTION OF THE DRAWINGS

The present invention is directed to methods and structures for converting static signals within an IC to alternating signals that can be viewed (measured) using an electron beam deflection device to determine the level (high or low) of the static signals. The methods and structures are described with particular reference to interconnect structures of PLDS. Although the methods and structures according to the present invention are described below with reference to PLDs, the disclosed circuit may be beneficially utilized in other types of ICs. Therefore, the appended claims should not necessarily be limited to PLDS.

Figure 2:
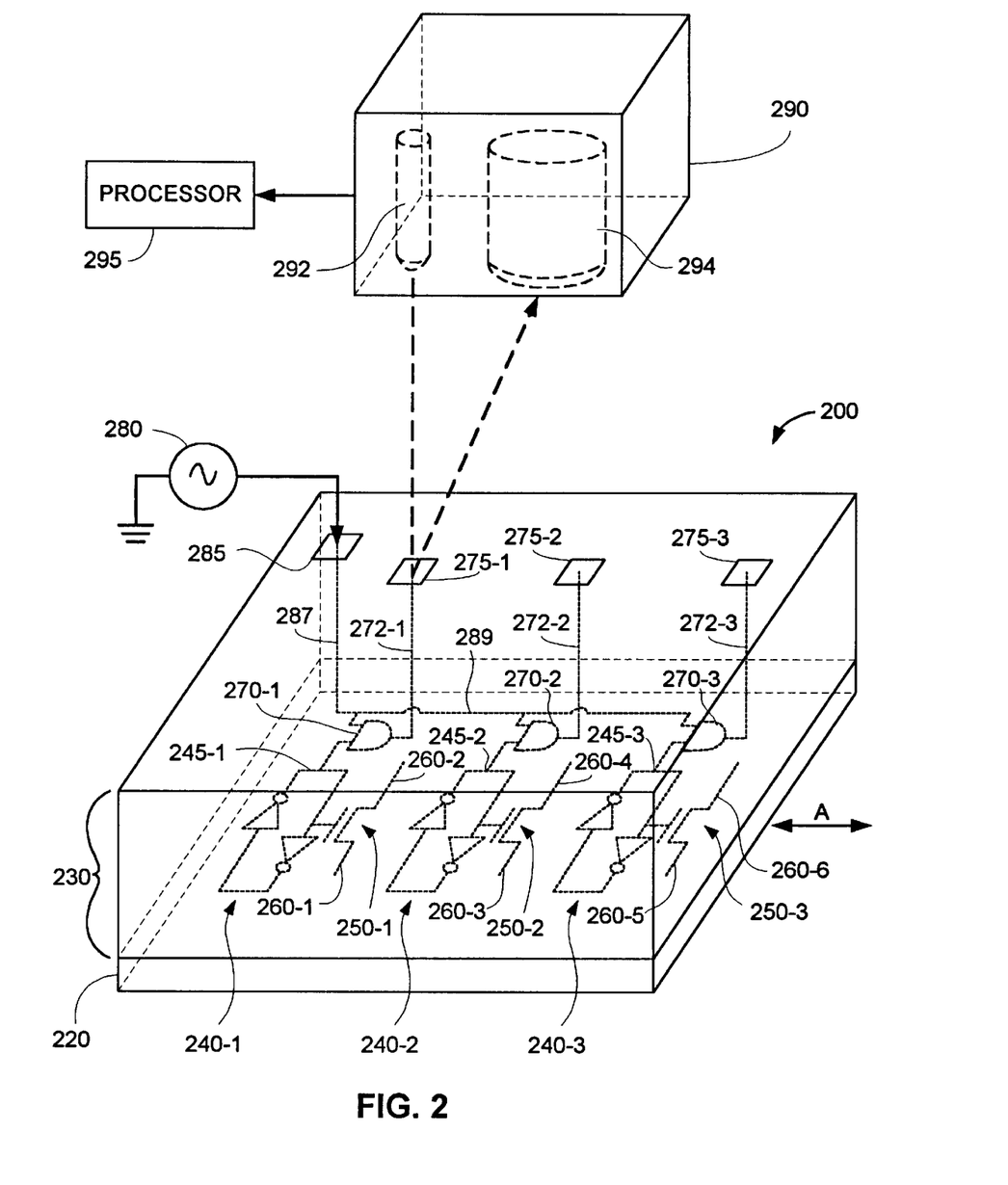
FIG. 2 is a perspective view showing a PLD in accordance with a first embodiment of the present invention, along with an electron beam deflection device for viewing the PLD.

FIG. 2 is a perspective view showing a PLD 200 according to a first embodiment of the present invention. PLD 200 includes a substrate 220 and a conductor region 230 formed over substrate 220. In the present application, the term "conductor region" generally refers to materials and structures formed on substrate 220 after fabrication of transistors. For example, in one embodiment the term "conductor region" refers to layers of metal lines and insulation material, such as shown in FIG. 1(A). However, the term "conductor region" can include other structures and materials covering a surface of substrate 220 (i.e., such that test points of PLD 200 are obscured). Therefore, the term "conductor region" is not intended to be limiting.

PLD 200 also includes multiple transistors (not shown) that are fabricated on a surface of substrate 220 (e.g., silicon) that form, for example, SRAM cells 240-1 through 240-3 and pass transistors 250-1 through 250-3, along with other programmable circuitry of PLD 200. As in conventional PLD 100-2 (see FIG. 1(B)), SRAM cells 240-1 through 240-3 (each illustrated as two inverters connected in a loop) each store configuration data used to control an associated pass transistor 250-1 through 250-3. Specifically, the gate of each pass transistor 250-1 through 250-3 is connected to an associated point (node) 245-1 through 245-3 that is maintained at a static signal level in accordance with configuration data stored in SRAM cells 240-1 through 240-3, respectively. The terminals of pass transistors 250-1 through 250-3 are connected to associated pairs of interconnect line segments 260-1 through 260-6. Interconnect line segments 260-1 through 260-6 are connected, for example, to logic resources (not shown) of PLD 200. To implement a particular logic operation, a user configures SRAM cells 240-1 through 240-3 such that signals are transmitted (or not transmitted) between associated pairs of interconnect line segments 260-1 through 260-6 based on the state (open or closed) of pass transistors 250-1 through 250-3.

In accordance with a first aspect of the present invention, PLD 200 includes structures for facilitating testing of static signal levels using an electron beam deflection device 290. First, selected test points (nodes) 245-1 through 245-3 are connected to a first terminal of an associated switch 270-1 through 270-3. Each switch 270-1 through 270-3 includes a second terminal that is connected to receive an alternating control signal. Depending upon the level (i.e., high or low) of the static signal at test points 245-1 through 245-3, switches 270-1 through 270-3 generate either an alternating output signal (i.e., alternating between high and low) having a frequency equal to that of the alternating control signal, or a constant signal (i.e., high or low). The output terminals of switches 270-1 through 270-3 are connected by metal vias (lines) 272-1 through 272-3 that extend vertically through conductor region 230 and are connected to pads 275-1 through 275-3, respectively, that are located (exposed) on a surface of conductor region 230. Therefore, the output signals from switches 270-1 through 270-3 are transmitted to the surface of PLD 200.

In accordance with a second aspect of the present invention, a method is provided for testing static signal levels generated at points 245-1 through 245-3 of PLD 200 (which are covered by conductor region 230) using an electron beam deflection device 290. In order to check the expected start-up condition of SRAM cells 240-1 through 240-3, the testing process is typically performed before PLD 200 is configured. However, the testing process can be performed after PLD 200 is configured using predetermined configuration data that is stored in SRAM cells 240-1 through 240-3. In either case, SRAM cells 240-1 through 240-3 apply static signal levels to first terminals of switches 270-1 through 270-3, respectively. To facilitate detection by electron beam deflection device 290, an alternating signal source 280 transmits an alternating control signal to second terminals of switches 270-1 through 270-3. Switches 270-1 through 270-3 are constructed such that they either generate an alternating output signal if the applied static signal is at a first logic level, or a constant output signal if the applied static signal is at a second logic level. For example, if SRAM cell 240-1 is programmed to apply a 5 volt static signal at point 245-1 and switch 270-1 is an AND gate, then the alternating control signal (i.e., 0 to 5 volt amplitude) generated by source 280 causes switch 270-1 to generate an alternating output signal having the same frequency as that of the alternating control signal. If SRAM cell 240-1 is programmed to apply a 0 volt static signal at point 245-1, then the alternating control signal generated by source 280 does not cause switch 270-1 to generate an alternating output signal, but rather causes switch 270-1 to generate a constant low output signal. The alternating or constant output signals from switches 270-1 through 270-3 are transmitted to associated pads 275-1 through 275-3 that are located on an exposed surface of PLD 200. Electron beam deflection device 290 is then utilized to look for an alternating output signal at each pad 275-1 through 275-3. By converting the static signal level either to a constant output signal that is not detectable by electron beam deflection device 290, or to an alternating output signal that can be detected (measured) by electron beam deflection device 290, the state (high or low) of the static signal level can be readily determined. In addition, by transmitting the output signal to pads 275-1 through 275-3 that are located on a surface of conductor region 230, static signal levels generated deep within the PLD 200 can be conveniently detected using electron beam deflection device 290.

As shown in FIG. 2, electron beam deflection device 290 is mounted over PLD 200. Electron beam deflection device 290 includes an electron emission device 292 for generating a stream of electrons that is directed to pad 275-1 of PLD 200. Electrons reflected from pad 275-1 are collected by a reception device 294 that measures the energy distribution of electrons leaving point 275-1 in response to electron beam bombardment. Data regarding this energy distribution that corresponds to the static signal level at point 245-1 is then transmitted to a processor (such as a computer or dedicated circuit), where the data is compared with expected values. In one embodiment, PLD 200 is then translated (moved) along the direction indicated by arrow A (shown at the right of PLD 200) in order to perform testing at pads 275-2 and 275-3. Alternatively, a fixture holds PLD 200 and pads 275-1 through 275-3 are scanned by electron beam deflection device 290.

In one embodiment, alternating signal source 280 is external to PLD 200 and generates a suitable alternating signal (e.g., 1 MHz) that is applied to the second terminals of switches 270-1 through 270-3 via an external pad 285, a vertical conductor 287 and a distribution line 289. In another embodiment (not shown), an alternating signal source can be provided internally within PLD 200 such that, for example, a 1 MHz signal is applied to the second terminals of switches 270-1 through 270-3 via distribution line 289. The term "alternating signal source" is utilized herein to cover signal sources associated with any periodic signals, such as sine wave signals, square wave signals, and saw-tooth signals.

FIGS. 3(A) through 3(D) are simplified circuit diagrams respectively showing switch circuits 270-1A through 270-1D that can be used to transform the static signal levels at point 245-1 (see FIG. 2) to an associated alternating output signal. Similar device structures are utilized to form switches 270-2 and 270-3.

Figure 3A:
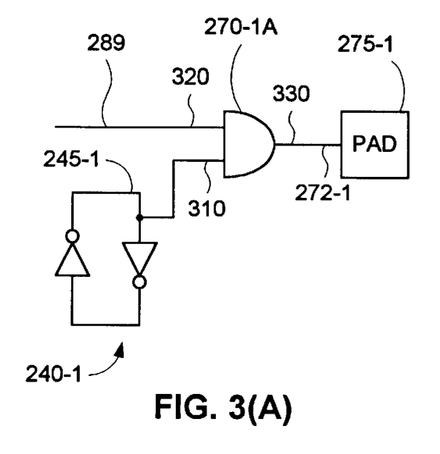
FIGS. 3(A), 3(B), 3(C) and 3(D) are simplified circuit diagrams showing switch circuits used to transform static signals to alternating signals.

Referring to FIG. 3(A), in accordance with one variation, switch 270-1A is implemented by an AND logic gate having a first terminal 310 connected to point 245-1, a second terminal 320 connected to distribution line 289, and an output terminal 330 connected to pad 275-1 by line 272-1. With this embodiment, if point 245-1 is at a static low level, then the output signal from AND gate 270-1A remains low in response to the alternating control signal received on line 289. Alternatively, if point 245-1 is at a static high level, then the output signal from AND gate 270-1A alternates between high and low in response to the alternating control signal received on line 289.

Figure 3B:
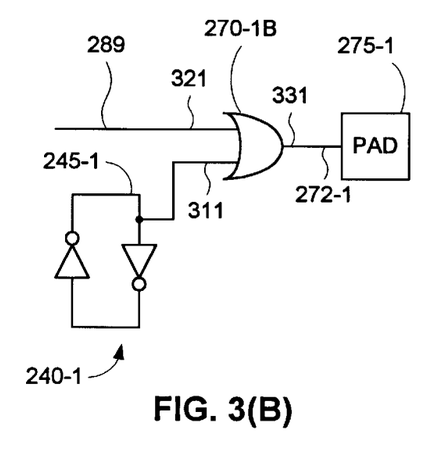

Referring to FIG. 3(B), in accordance with a second variation, switch 270-1B is implemented by an OR logic gate having a first terminal 311 connected to point 245-1, a second terminal 321 connected to distribution line 289, and an output terminal 331 connected to pad 275-1 by line 272-1. With this embodiment, if point 245-1 is at a static high level, then the output signal from OR gate 270-1B remains high in response to the alternating control signal received on line 289. Alternatively, if point 245-1 is at a static low level, then the output signal from OR gate 270-1B alternates between high and low in response to the alternating control signal received on line 289.

Figure 3C:
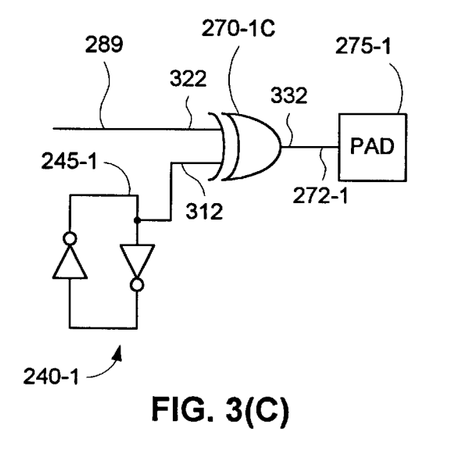

Referring to FIG. 3(C), in accordance with a third variation, switch 270-1C is implemented by an exclusive-OR logic gate having a first terminal 312 connected to point 245-1, a second terminal 322 connected to distribution line 289, and an output terminal 332 connected to pad 275-1 by line 272-1. With this embodiment, if point 245-1 is at a static high level, then the output signal from exclusive-OR gate 270-1C alternates in a first phase in response to the alternating control signal received on line 289. Alternatively, if point 245-1 is at a static low level, then the output signal from exclusive-OR gate 270-1C alternates in a second phase (approximately 180% from the first phase) in response to the alternating control signal received on line 289. Typical electron beam deflection equipment is able to distinguish between the first and second phases, thereby detecting the signal level at point 245-1.

Figure 3D:
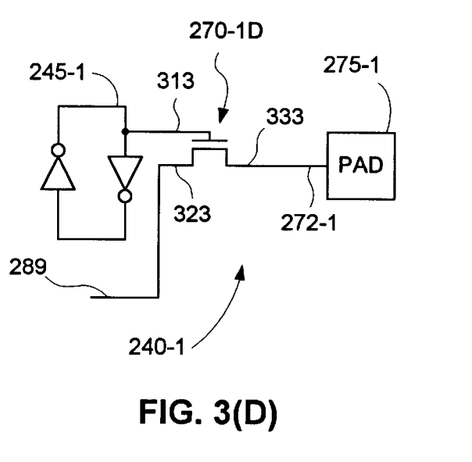

Referring to FIG. 3(D), in accordance with a fourth variation, switch 270-1D is implemented by a pass transistor having a first terminal (gate) 313 connected to point 245-1, a second terminal 323 connected to distribution line 289, and a third (output) terminal 333 connected to pad 275-1 by line 272-1. With this embodiment, if point 245-1 is at a static low level, then pass transistor 270-1D remains off and the voltage at output terminal 333 of pass transistor 270-1D remains at a relatively constant level (which may float high or low). Alternatively, if point 245-1 is at a static high level, then pass transistor 270-1D turns on and the voltage at output terminal 333 of pass transistor 270-1C alternates between high and low in response to the alternating control signal received on line 289.

Although FIGS. 3(A) through 3(D) show several possible switch structures that can be used in PLD 200, other switch structures are also possible. For example, the static signal from point 245-1 may be transmitted to an analog comparator controlled by a reference voltage and whose output terminal is connected to the first terminal of switch 270-1. Therefore, the switch structures shown in FIGS. 3(A) through 3(D) are not intended to be limiting.

Further, although the test signals are referred to herein as "static" and the illustrations show signals being generated by latches, the methods described herein may also be used to detect low frequency signals (i.e., signals that alternate at frequencies below the detectable range of electron beam deflection equipment). For example, signals having a frequency of 100 KHz may not be detected by a particular electron beam deflection equipment whose optimum detection frequency is 1 MHz. The methods described herein may be used to detect these low frequency signals using, for example, the exclusive-OR switch 270-1B (see FIG. 3(C)) and detecting phase changes in the output signal, which would be derived from a slowly alternating source, typically not the latch 240-1 shown in FIG. 3(C), though if latch 240-1 is being re-loaded at a frequency of 100 KHz, latch 240-1 can also generate such a signal.

Figure 4:
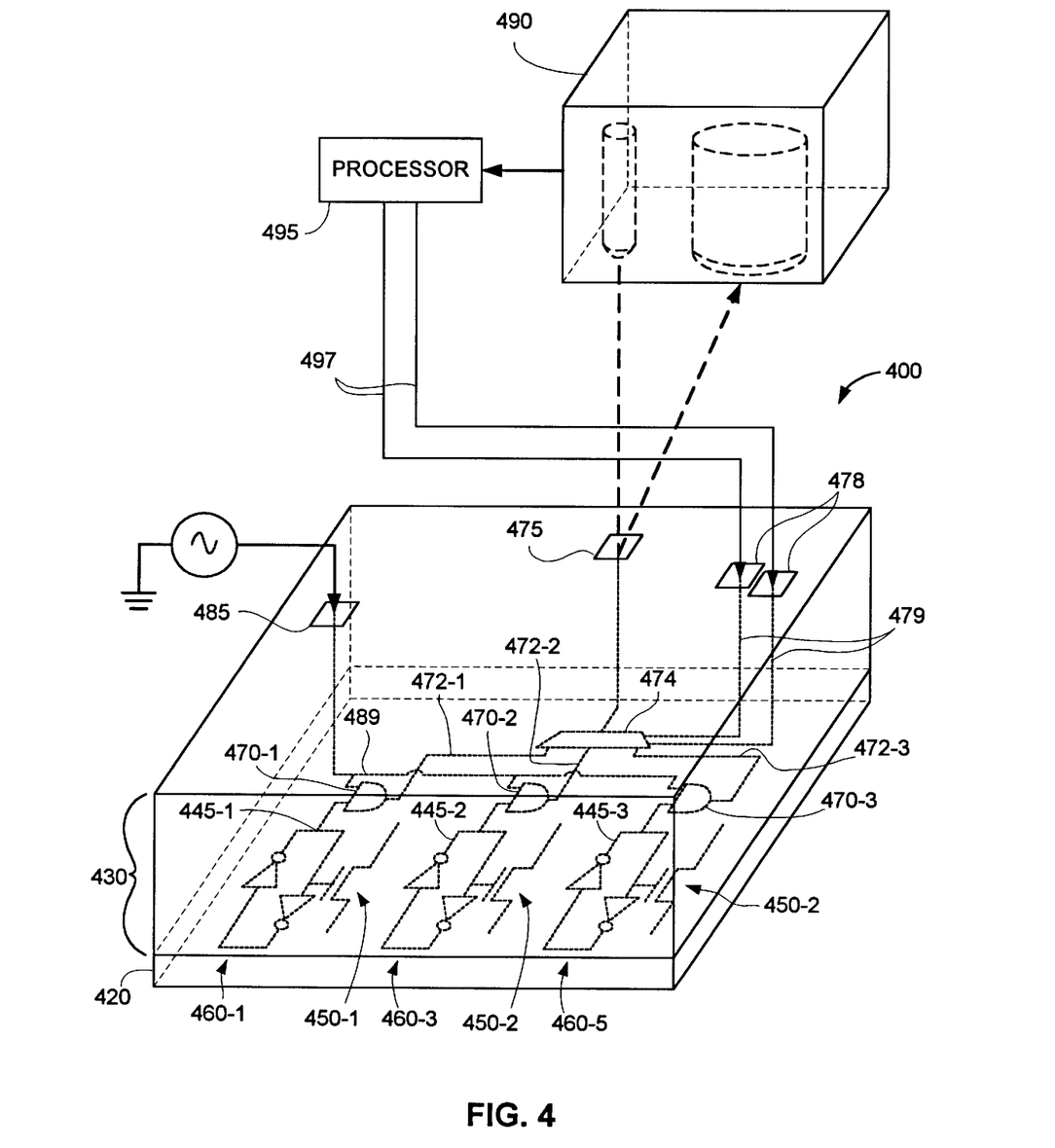
FIG. 4 is a perspective view showing a PLD in accordance with a second embodiment of the present invention, along with an electron beam deflection device for viewing the PLD.

FIG. 4 is a perspective view showing a PLD 400 according to a second embodiment of the present invention. PLD 400 includes a substrate 420 and a conductor region 430 formed over substrate 420. PLD 400 also includes SRAM cells 440-1 through 440-3 and pass transistors 450-1 through 450-3. The gate of each pass transistor 450-1 through 450-3 is connected to an associated point (node) 445-1 through 445-3 that is maintained at a static signal level in accordance with configuration data stored in SRAM cells 440-1 through 440-3, respectively. The configuration data (static signal levels) stored in SRAM cells 440-1 through 440-3 is also applied from points 445-1 through 445-3 to the first terminals of switches 470-1 through 470-3, respectively. An alternating control signal is transmitted to the second terminals of switches 470-1 through 470-3. In response, switches 470-1 through 470-3 generate alternating output signals having amplitudes that are directly related to the static signal levels applied to their first terminals by SRAM cells 450-1 through 450-3.

In accordance with the second embodiment, the static states at points 445-1 through 445-3 are routed through a multiplexing circuit 474 to a single pad 475. Specifically, the alternating output signals transmitted from each of the output terminals of switches 470-1 through 470-3 are transmitted via lines 472-1 through 472-3 to the input terminals of a multiplexer 474. Multiplexer 474 receives control signals on lines 479 to selectively pass one of these alternating output signals to output pad 475. In the disclosed embodiment, the multiplexer control signals are transmitted from a processor 495 to coordinate with detection signals received from electron beam deflection device 490. These multiplexer control signals are transmitted via lines 497 to pads 478 via test probes, and from pads 478 to lines 479. In another embodiment, these control signals are generated internally. By utilizing multiplexer 474 to route one of the alternating output signals from switches 470-1 through 470-3 to a single pad 475, the number of pads required to test the static signal levels within PLD 400 using electron beam deflection device 490 is significantly reduced. Therefore, the amount of surface space required to test several static signals is reduced, and the need to scan different portions of the surface of PLD 400 to locate pads associated with the static signals is eliminated or reduced.

Figure 5:
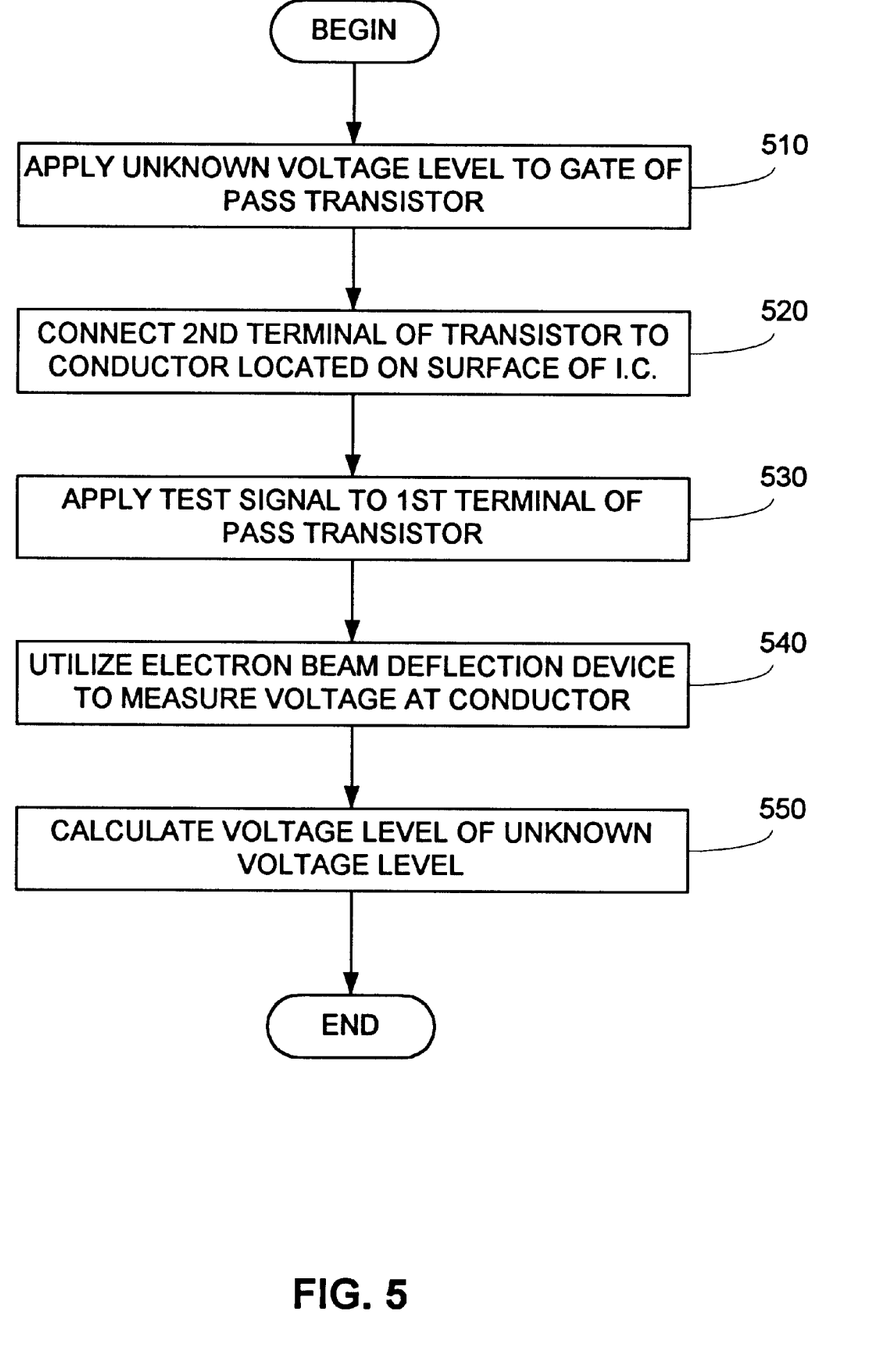
FIG. 5 is a flow diagram showing method steps for determining the voltage level of a static signal within an IC using an electron beam deflection device in accordance with a third embodiment of the present invention.

FIG. 5 is a flow diagram showing a method for determining the voltage level of a static signal within an IC using an electron beam deflection device in accordance with a third embodiment of the present invention. In one embodiment, the method utilizes switch 270-1D (FIG. 3(D)) to determine the voltage level of the signal at point (node) 245-1. Therefore, the following example refers to both the flowchart shown in FIG. 5 and the circuit diagram shown in FIG. 3(D).

Referring to FIG. 3(D), the signal (unknown voltage level) at point 245-1 is applied to gate 313 (first terminal) of switch 270-1D (Step 510), an initial alternating control (test) signal is transmitted to (second) terminal 323 via line 289 (Step 530), and (output) terminal 333 is connected to pad (conductor) 275-1 (Step 520). These connections satisfy Steps 510 through 530 of the process depicted in the flowchart shown in FIG. 5. In one embodiment, the initial test signal is selected to have a peak value that is greater than one threshold voltage above an expected voltage level at node 245-1 (e.g., Vdd). Note that the order in which Steps 510 through 530 are performed is not important. An electron beam deflection device is then used in the manner described above to observe pad (conductor) 275-1 (Step 540) for purposes of measuring the voltage of the alternating signal at pad 275-1. Known electron beam deflection devices are able to measure this voltage with an accuracy of 10 millivolts. In Step 550, the approximate (actual) voltage level at point 245-1 is then calculated by adding the threshold voltage of switch 270-1D (which is either known or experimentally determined) to the measured voltage at point 245-1.

Figure 6A:
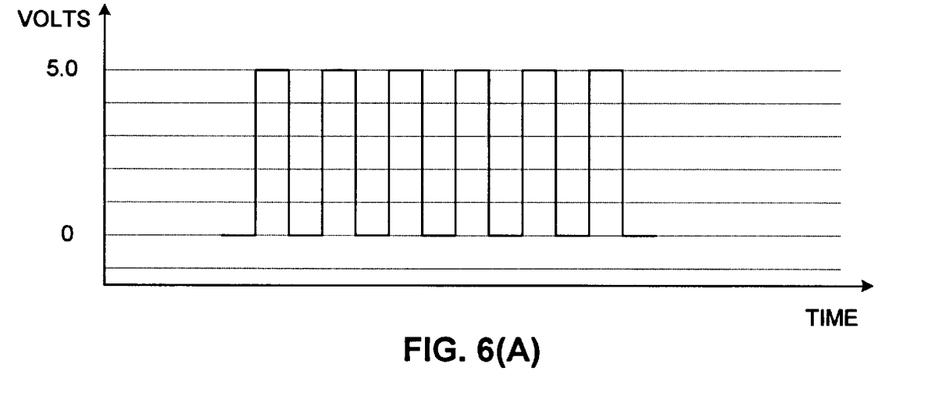
FIGS. 6(A) and 6(B) show waveforms illustrating an example of the voltage level determining method in accordance with the third embodiment.
Figure 6B:
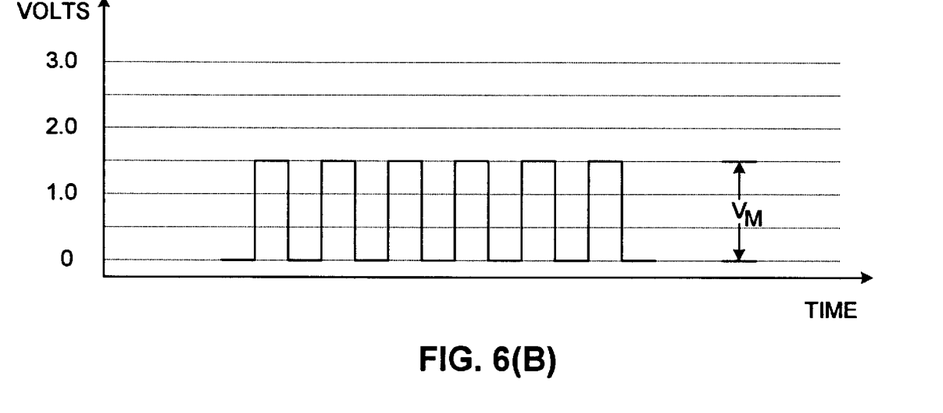

FIGS. 6(A) and 6(B) show waveforms illustrating an example of how the voltage level at point 245-1 can be calculated in accordance with the present invention. This example is illustrative of possible calculation methods, and is not intended to be limiting. For purposes of this example, the threshold voltage of switch 270-1D is 1.5 volts.

FIG. 6(A) shows a square-wave control (test) signal alternating between Vdd (e.g., 5 volts) and ground (e.g., 0 volts). It is not necessary for the alternating signal on line 289 to alternate between the same voltage levels as the voltage levels being measured. The voltage on line 289 must merely be higher than one threshold voltage below the highest voltage of the point being measured. As indicated in FIG. 6(B), the square-wave control signal causes switch 270-1D (see FIG. 3(D)) to generate an alternating signal at pad 275-1D that has a measured voltage $V_M$ of 1.5 volts. In accordance with this example, the voltage level at point 245-1 is then calculated by adding the threshold voltage of switch 270-1D (i.e., 1.5 volts) to the measured voltage $V_M$ 1.5 volts, thereby determining that the voltage at point 245-1 is 3.0 volts.

While the above example is directed to switch (i.e., pass transistor) 270-1D, the method of the third embodiment may also be utilized using other switch types. For example, the method may be performed to measure the low expected value at point 245-1 using a P-channel transistor. In this case, the alternating signal at pad 275-1 has a voltage that is greater than the voltage at point 245-1 plus the magnitude of the threshold voltage of the P-channel transistor (e.g., ground). The actual voltage at point 245-1 would then be calculated by adding the magnitude of the threshold voltage to the measured voltage at pad 275-1. Alternatively, a transmission gate comprising a complimentary pass transistor pair may be used to measure both the high expected value and the low expected value and avoid the threshold voltage drop. In this case, P-channel and N-channel transistors are connected in parallel with point 245-1 connected to the gates of both transistors. The sources of these transistors can either be tied together or separated depending upon the measurement techniques used. Therefore, those skilled in the art will recognize that the method of the third embodiment can be performed using other switches and control signal manipulations without departing from the spirit of the disclosed method steps.

Although the present invention has been described in considerable detail with reference to certain preferred embodiments thereof, one of ordinary skill would recognize that several variations to the disclosed embodiments are possible. For example, although the static signal levels generated at points 345-1 through 345-3 are transmitted to multiplexer 474 through associated gates 350-1 through 350-3, it is also possible to transmit the static signal levels directly through multiplexer 474 to a single switch controlled by an alternating signal. Further, the control signals transmitted to multiplexer 474 may be generated by, for example, an on-chip counter that is triggered by an externally applied signal. Therefore, the spirit and scope of the appended claims should not be limited to the description of the preferred embodiments contained herein.

We claim:

1. A method for testing a test signal on an integrated circuit using an electron beam deflection device, the method comprises the steps of:

applying the test signal to a first terminal of a switch;

transmitting an alternating control signal to the second terminal of the switch such that the switch generates an output signal that is either alternating if the test signal is at a first signal level, or constant if the test signal is at a second signal level; and utilizing the electron beam deflection device to determine whether the output signal is alternating or constant.

2. The method according to claim 1, wherein the method further comprises the steps of:

transmitting the output signal to a pad located on an exposed surface of the integrated circuit; and directing an electron beam emitted from the electron beam deflection device to the pad.

3. The method of claim 2, wherein the step of transmitting the output signal to a pad comprises transmitting the output signal to an input terminal of a multiplexer, and controlling the multiplexer to pass the output signal to the pad.

4. The method of claim 1, wherein the steps of applying and transmitting comprise applying the test signal to the first terminal of an AND gate and transmitting the alternating control signal to the second terminal of the AND gate.

5. The method of claim 1, wherein the steps of applying and transmitting comprise applying the test signal to the first terminal of an OR gate and transmitting the alternating control signal to the second terminal of the OR gate.

6. The method of claim 1, wherein the steps of applying and transmitting comprise applying the test signal to the first terminal of an exclusive-OR gate and transmitting the alternating control signal to the second terminal of the exclusive-OR gate.

7. The method of claim 1, wherein the steps of applying and transmitting comprise applying the test signal to the gate of a pass transistor and transmitting the alternating control signal to a first terminal of the pass transistor.

8. An integrated circuit device comprising:

a substrate;

a device fabricated on the substrate for generating a test signal at a first test point;

a switch formed on the substrate having a first terminal connected to the first test point, a second terminal controlled by an alternating control signal, and an output terminal, wherein the switch generates an output signal on the output terminal that is alternating if the test signal is at a first signal level, or is constant if the test signal is at a second signal level; and a pad formed on a viewable portion of the integrated circuit device and connected to the output terminal of the switch.

9. The integrated circuit device according to claim 8, further comprising:

a conductor region formed over the substrate such that a portion of the conductor region covers the first test point.

10. The integrated circuit device according to claim 8, further comprising:

a second device fabricated on the substrate for generating a second test signal at a second test point;

a second switch formed on the substrate having a second terminal connected to the second test point, a second terminal controlled by the alternating control signal, and an output terminal, wherein the second switch generates an output signal on the output terminal that is alternating if the test signal is at a first signal level, or is constant if the test signal is at a second signal level; and a second pad formed on a surface of the integrated circuit device and connected to the output terminal of the second switch.

11. The integrated circuit device according to claim 8, further comprising:

a second device fabricated on the substrate for generating a second test signal at a second test point;

a second switch formed on the substrate having a second terminal connected to the second test point, a second terminal controlled by the alternating control signal, and an output terminal, wherein the second switch generates an output signal on the output terminal that is alternating if the test signal is at a first signal level, or is constant if the test signal is at a second signal level; and a multiplexer having a first input terminal connected to the output terminal of the first switch, a second input terminal connected to the output terminal of the second switch, and an output terminal connected to the pad.

12. The integrated circuit device of claim 8, wherein the switch comprises an AND gate having a first input terminal for receiving the test signal and a second input terminal for receiving the alternating control signal.

13. The integrated circuit device of claim 8, wherein the switch comprises an OR gate having a first input terminal for receiving the test signal and a second input terminal for receiving the alternating control signal.

14. The integrated circuit device of claim 8, wherein the switch comprises an exclusive-OR gate having a first input terminal for receiving the test signal and a second input terminal for receiving the alternating control signal.

15. The integrated circuit device of claim 8, wherein the switch comprises a pass transistor having a gate for receiving the test signal, a first terminal for receiving the alternating control signal and a second terminal connected to the pad.

16. A method for determining the actual voltage level of a signal generated at a node in an integrated circuit using an electron beam deflection device, the method comprises the steps of:

applying the signal to a first terminal of a switch and an alternating control signal to a second terminal of the switch, wherein the switch has a threshold voltage, utilizing the electron beam deflection device to determine a measured voltage level of an alternating signal generated in a conductor connected to a third terminal of the switch, calculating the actual voltage level of the signal by combining the measured voltage level of the alternating signal and the threshold voltage of the switch.

17. The method according to claim 16, wherein the switch comprises an N-channel transistor, wherein the actual voltage level is applied to a gate of the N-channel transistor, wherein the alternating control signal has a peak value that is greater than the actual voltage level plus the threshold voltage of the switch, and wherein the step of calculating the actual voltage level comprises adding the threshold voltage and the measured voltage level.

18. The method according to claim 16, wherein the switch comprises a P-channel transistor, wherein the actual voltage level is applied to a gate of the N-channel transistor, wherein the alternating control signal has a lowermost value that is less than the actual voltage level minus the threshold voltage of the switch, and wherein the step of calculating the actual voltage level comprises subtracting the threshold voltage from the measured voltage level.

* * * * *